United States Patent [19]
White

[11] 4,180,765
[45] Dec. 25, 1979

[54] HIGH SPEED DEFLECTION YOKE DRIVER CIRCUIT

[75] Inventor: Charles M. White, Melbourne, Fla.

[73] Assignee: Harris Corporation, Cleveland, Ohio

[21] Appl. No.: 909,219

[22] Filed: May 24, 1978

[51] Int. Cl.² .................. H01J 29/70; H01J 29/76
[52] U.S. Cl. .................................................. 315/408
[58] Field of Search ....................... 315/408, 396, 397

[56] References Cited
U.S. PATENT DOCUMENTS

| | | | |
|---|---|---|---|
| 3,774,068 | 11/1973 | Yasumatsuya | 315/397 |
| 3,786,303 | 1/1974 | Hilburn | 315/397 |
| 3,921,036 | 11/1975 | Morio et al. | 315/396 |

*Primary Examiner*—Theodore M. Blum

[57] ABSTRACT

A driver circuit (68) for a CRT magnetic deflection yoke (80) includes a current switching transistor (88) connected across a deflection voltage source (84) in series with the deflection yoke (80). The transistor switch (88) is periodically switched "on" and "off" to generate the proper current waveform in the deflection yoke. A clamping circuit (74) including several clamping diodes (90, 92) prevents the voltage across the current switching transistor (88) from dropping below a limiting voltage level. The transistor is thus held out of saturation. When the current switch is "on", a differential amplifier (78) controls base drive to the transistor (88) in accordance with the voltage drop across the clamping diodes (90, 92) in order to maintain the current through the clamping diodes (90, 92) at a low, substantially fixed level, independently of variations in deflection yoke current. Speed of operation is thus enhanced by reducing charge storage effects in the clamping diodes (90, 92).

8 Claims, 8 Drawing Figures

YOKE CURRENT

CURRENT THROUGH
CLAMPING DIODE 56

COLLECTOR CURRENT
OF TRANSISTOR 58

CURRENT THROUGH
CLAMPING DIODES 90, 92

COLLECTOR CURRENT
OF TRANSISTOR 88

HIGH SPEED DEFLECTION YOKE DRIVER CIRCUIT

BACKGROUND AND FIELD OF THE INVENTION

The present invention relates generally to circuits for driving inductive loads, and more particularly to a high speed CRT deflection yoke driver.

The switching of current through an inductive load can be achieved through the use of a transistor whose primary current path is connected in series with the current path through the inductive load, and by then switching the transistor between saturation and cut off. When high speed switching of the inductive load is required, however, this approach is not entirely satisfactory. The transistor storage time resulting from saturation of the transistor during its "on" state significantly limits the switching speed of the transistor. To circumvent this problem, it was the practice in the past to include a clamping circuit across the transistor. This clamping circuit prevented the collector-emitter potential from dropping below a certain limit, thus preventing the transistor from dropping into saturation. In order to prevent the transistor from drawing unlimited current from the clamping circuit, however, it was then necessary to connect the transistor in a current source (or sink) configuration. The current through the transistor was therefore limited to a preset level when it was in the "on" state. The resulting driver circuit was capable of providing much more rapid switching speeds than had been available when the transistor had been utilized without these refinements.

Certain cathode ray tube (CRT) display systems require high speed inductive switching of this nature. In some advertising layout systems using video display terminals, for example, the electron beam is moved to a particular position on the fact of the CRT, and then a small area of the screen, sometimes referred to as a character field, is scanned in a conventional raster scanning technique. A particular character or other design is thus displayed within that character field. An additional complication arises in these applications by the need to vary the size of the character field in order to display characters having different point sizes. In terms of the deflection circuitry, this means that the deflection driver circuit must not only be capable of operating at high speed, but must also be capable of operating at different levels of deflection current, depending upon the size of the character which is to be displayed.

BRIEF SUMMARY OF THE INVENTION

In previous systems, the switched current source had to be set to carry the peak magnitude of current that would flow in the deflection yoke when the character fields of largest size were being displayed. When smaller character fields were being displayed, then, the peak magnitude of the current flowing through the deflection yoke was much smaller than the magnitude of the current in the current source. Consequently, a large amount of excess current would be flowing through the clamping circuit to the current source. It was found that the speed with which the system could operate was limited by the magnitude of the excess current, due to a tendency to saturate the clamping circuit.

It is an object of the present invention to provide a circuit which can rapidly provide the switching of a load circuit substantially independently of variations in the magnitude of the peak current utilized by the load circuit.

It is a further object of the present invention to provide a circuit as in the foregoing object for particular use in a magnetic deflection system.

It is a more detailed object of the present invention to provide means for controlling the level of current passing through the switched current source so as to limit the magnitude of current flowing through the clamping diode to a limiting current level.

In accordance with the present invention, a circuit is provided which includes a current switching circuit and a clamping circuit for preventing the voltage across the current switching circuit from dropping below a limiting voltage level. Circuit means (which may, for example, be the deflection yoke of a CRT display system) is coupled to the current switching circuit such that the operation of the current switching circuit influences the operation of the circuit means. Means are then provided for causing the current switching circuit to switch between a first state, wherein substantially no current flows through it, and a second state wherein a controlled current flows through it. A control circuit is associated with the current switching circuit so as to control the current flow therethrough. This control circuit operates, when the current switching circuit is in its second state, to limit current flow through the current switching circuit so that current flow through the clamping circuit does not exceed a limiting current level, independently of variations in the amount of current passing between the circuit means and the current switching circuit.

In accordance with a more limited aspect of the present invention, means are included for providing an indication which is representative of the level of current flowing through the clamping means, and the control circuit includes means responsive to this indication for adjusting the current passing through the current switching circuit to maintain this indication at a substantially fixed level.

In accordance with another aspect of the present invention, a circuit of this type is provided in conjunction with a CRT utilizing magnetic deflection of an electron beam across at least a part of the face of the CRT.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION OF THE DRAWINGS

Figure 1:
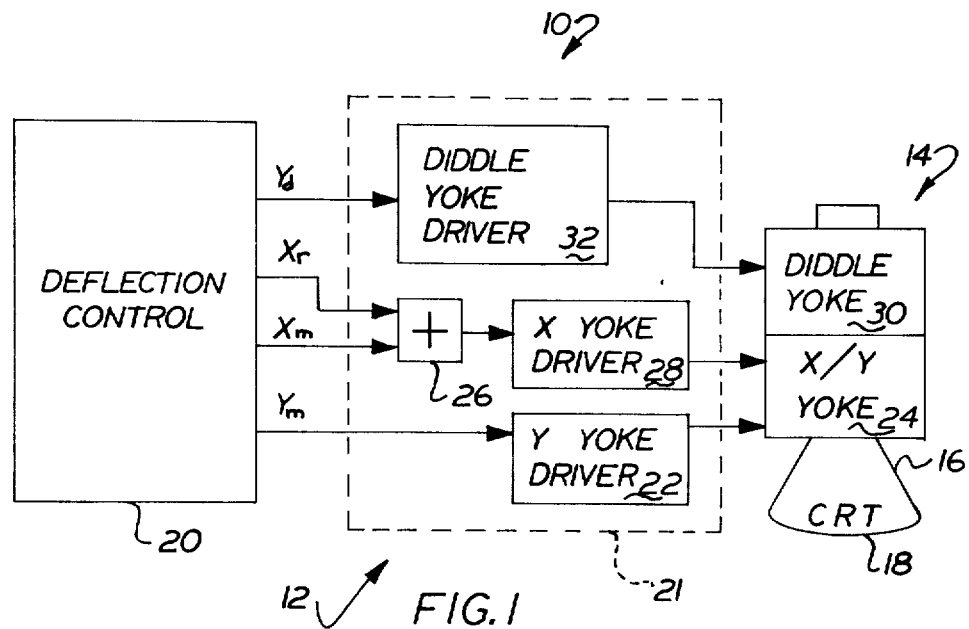
FIG. 1 is a block diagram of a magnetic deflection system for a CRT wherein the present invention may conveniently find use.

There is illustrated in FIG. 1 a CRT deflection system 10 employing minor field raster scanning in order to generate individual characters. The invention will be described in this environment since it is particularly well suited to use in this system. The invention is not, however, solely applicable to this system, but instead has a much broader range of applications.

Deflection system 10 generally includes a deflection control system 12 for providing control signals to deflection yokes 14 which are associated with a cathode ray tube (CRT) 16 having a display face 18. The deflection control system 12 includes a deflection control circuit 20 and a yoke driver section 21.

The deflection control circuit 20 provides four signals which control the deflection of the electron beam on the display face 18 of CRT 16. These four signals include two major deflection signals $X_M$ and $Y_M$, and two minor deflection signals $X_R$ and $Y_D$. The two major deflection signals $X_M$ and $Y_M$ are both analog signals which control the positioning of the electron beam to a particular character field on the face 18 of CRT 16. Upon arriving in a particular character field, raster scanning of the character field is carried out by means of the two minor deflection signals $X_R$ and $Y_D$. The signal $Y_D$ will cause the electron beam to scan rapidly back and forth between the upper and lower limits of the character field in the Y direction while the $X_R$ signal will cause the electron beam to more slowly move in the X direction from the left limit to the right limit of the character field. The major deflection signals will remain essentially fixed while this minor raster scanning is taking place.

The major Y deflection signal $Y_M$ is converted into a current signal for controlling the deflection in the Y direction by means of a Y yoke driver 22 which supplies the current signal to the portion of deflection yoke assembly 24 which produces deflection in the Y direction. The major and minor X deflection signals $X_M$ and $X_R$, respectively, are added together in an adder circuit 26 to provide a composite X deflection signal to an X yoke driver circuit 28. Yoke driver circuit 28 provides a current signal to the portion of yoke assembly 24 which produces deflection of the electron beam in the X direction.

In the system illustrated in FIG. 1, the minor raster scanning in the Y direction is produced by a separate deflection yoke 30, sometimes referred to in the art as a "diddle" yoke. The diddle yoke 30 serves to pre-deflect the electron beam prior to its entry into the main deflection yoke assembly 24.

The minor Y deflection signal $Y_D$ is connected to the diddle yoke 30 by means of a diddle yoke driver circuit 32. Diddle yoke driver 32 must be capable of providing extremely rapid slewing of the current through the diddle yoke in order to accomplish raster scanning of the character field. In addition, since the size of the character which is displayed on the face 18 of CRT 16 must vary in many applications (e.g., in ad layout systems, photocomposition systems, etc.), diddle yoke driver 32 must be capable of providing a current signal to diddle yoke 30 which varies in amplitude in accordance with the size of the character which is to be displayed.

Figure 2:
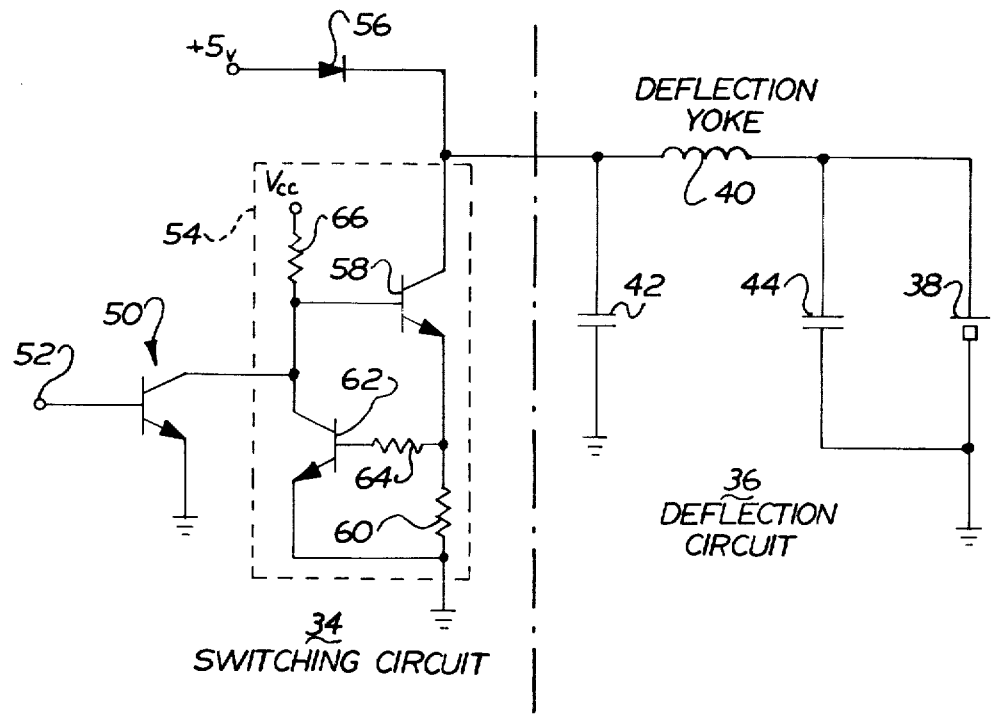
FIG. 2 is a circuit diagram of a deflection control circuit in accordance with the teachings of the prior art.

FIG. 2 illustrates a yoke scan driver circuit which may be utilized to perform the functions of diddle yoke driver 32, and which is constructed in accordance with prior art techniques. The technique embodied in this circuit is to produce a fast current ramp through the use of a switching circuit 34 in conjunction with a TV flyback-type deflection circuit 36.

The deflection circuit 36 generally includes a voltage source 38 having a deflection yoke 40 (e.g., diddle yoke 32) and a flyback capacitor 42 connected in series across it. In the figure, voltage source 38 is shown as having a capacitor 44 connected across it in order to improve its transit response. Switching circuit 34 is connected in parallel with the flyback capacitor 42, and generally includes an input switching transistor 50, a current sink 54, and a clamping diode 56.

In FIG. 2, current sink 54 includes a transistor 58 having an emitter resistor 60 with a fixed voltage applied thereacross. This fixed voltage is produced by connecting the base-emitter junction of a transistor 62 across the emitter resistor 60 of transistor 58 through a second, current limiting resistor 64. The collector of transistor 62 is connected to the base of transistor 58, and is also connected to a voltage supply $V_{CC}$ through a resistor 66. This introduces feedback which will result in the stabilization of the voltage drop across resistor 60 at a voltage which is somewhat larger than the base-emitter contact potential of transistor 62. The current through transistor 58 will therefore be fixed at the level which will produce this voltage drop across resistor 60.

Current sink 54 is switched on and off through the operation of the transistor switch 50 connected in parallel with transistor 62. When switching transistor 50 is in its "off," or high impedance state, then the current through transistor 58 will be fixed at a substantially constant level in the manner described above. When transistor 50 is fully "on" (saturated) then the voltage at the base of transistor 58 will be insufficient to energize the current sink, so that substantially no current will pass through the collector of transistor 58.

Figure 4A:
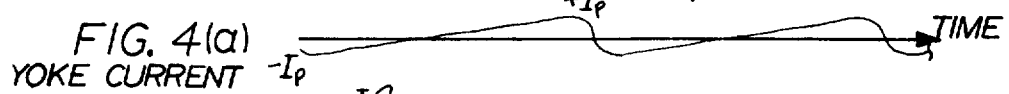
FIGS. 4a–4e are a graphic illustration of various current waveforms in the circuits of FIGS. 2 and 3.
Figure 4B:
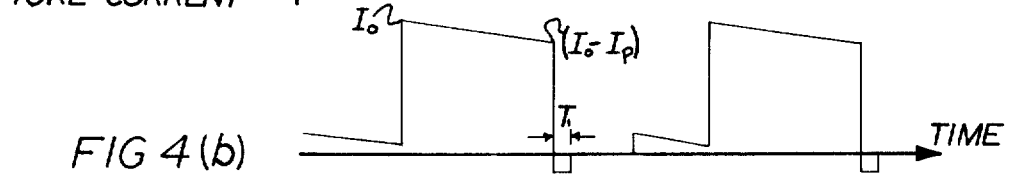
Figure 4C:
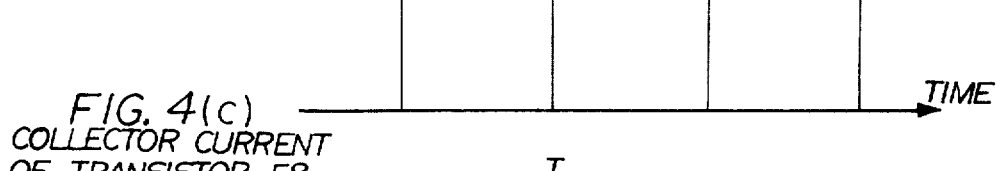

The minor Y deflection signal, which will be a periodic, rectangular waveform, will be applied to the input 52 of switching transistor 50. This will cause a periodic switching of current sink 54 between "on" and "off" states, and will result in a periodic deflection current being generated through deflection yoke 30. This is shown graphically in FIGS. 4(a) and 4(c), where current level is represented on the vertical axis and time is represented on the horizontal axis.

As stated previously, a clamping diode 56 will be connected between the collector of transistor 58 and a clamping voltage source (illustrated as +5 V) so as to prevent the voltage across current sink 54 from dropping below a specified voltage limit. Clamping diode 56 is necessary to prevent the transistor 58 of current sink 54 from saturating, and thereby slowing the speed of operation of the circuit.

As also stated previously, certain applications require that the maximum magnitude of the current passing through deflection yoke 30 be varied. In the system shown in FIG. 1, for example, it will be necessary to vary the maximum magnitude of the deflection yoke current in order to vary the size of the character being displayed. This can be accomplished by selecting the magnitude of voltage source 38 in accordance with the desired size of the character being displayed, by varying the "on" time of current sink 54, or by a combination of these two techniques. In any case, the magnitude of the current passing through current sink 54 must be selected to be at least as great as the maximum current level $I_O$ expected from deflection yoke 40. Otherwise, current sink 54 would limit the maximum current through deflection yoke 40, preventing the generation of the proper deflection yoke waveform.

When smaller characters are being displayed, then, the major portion of the current through current sink 54 will be supplied, not by deflection yoke 40, but rather by clamping diode 56. This is the condition illustrated in FIG. 4(a)-(c). In this situation the clamping diode 56 will be conducting a high level of current ($I_O-I_P$) immediately prior to shut-off of current sink 54. This, however, results in a large charge storage in diode 56. The only current which is available to remove the charge stored on clamping diode 56, however, is the yoke current which in this case is relatively small. Consequently, a charge storage time $I_1$ will exist which will inherently limit the speed of the deflection circuit.

An additional difficulty with the circuit relates to the speed with which the current being supplied to deflection yoke 30 is cut off. As the current through transistor 58 drops to a low level, the current passing through diode 56 must be exhausted before the current through deflection yoke 30 is in any way impeded. It is only after clamping diode 56 has cut off that the amount of current being supplied to deflection yoke 30 will begin to diminish. If the current waveform of current sink 54, had the ideal form shown in FIG. 4(c) (i.e., instantaneous shut-off) this effect would be unimportant. Since the trailing edge of the current pulse will, in fact, have a finite slope, this effect results in the addition of a time delay between the initiation of shutoff of current sink 54, and actual cutoff of current to deflection yoke 40. The speed with which current can be removed from the deflection yoke is limited by this effect.

The present invention contemplates aleviating these problems by sensing the amount of current passing through the clamping diode, and by then regulating the operation of the current sink so that the current through the clamping circuit remains at a low, substantially constant level independently of variations in the peak magnitude of the current flowing through deflection yoke 40.

Figure 3:
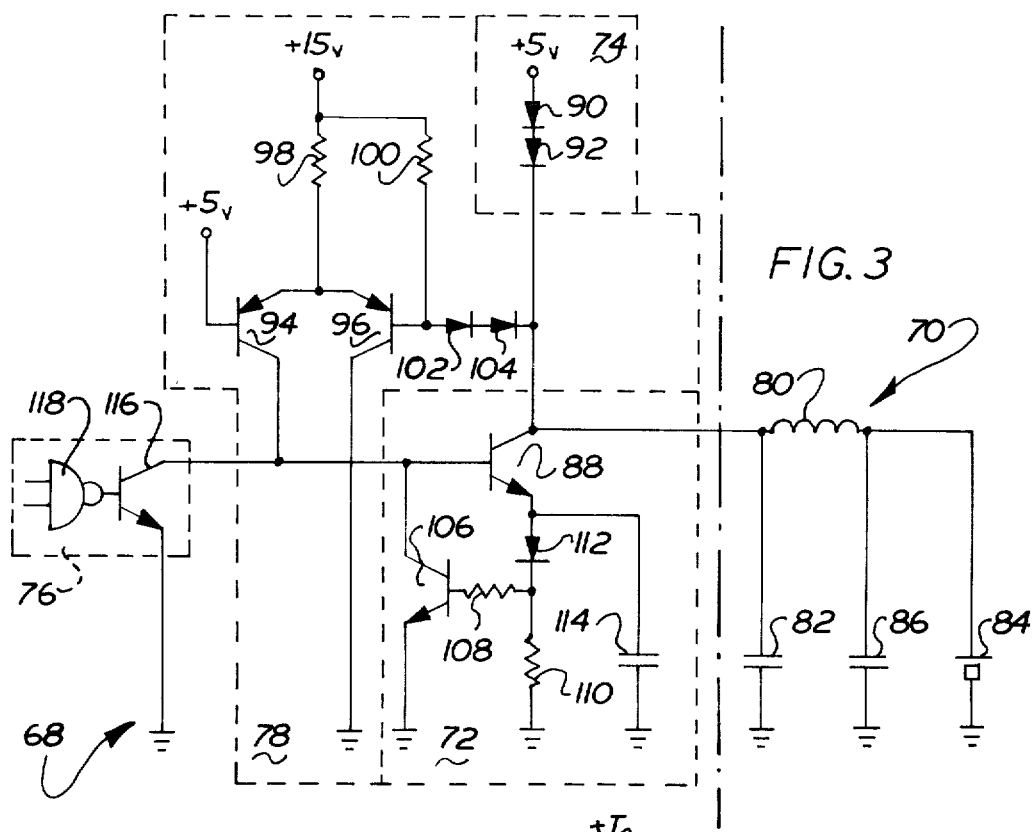
FIG. 3 is a circuit diagram of a deflection control circuit in accordance with the teachings of the present invention.

In FIG. 3, a circuit 68 is illustrated for controlling the operation of a deflection circuit 70. Circuit 68 includes a current switching circuit 72, a clamping circuit 74, an input switching circuit 76, and a current control circuit 78. As in FIG. 2, the deflection circuit includes a deflection yoke 80, and a flyback capacitor 82. Deflection yoke 80 is connected in series with current switch 72 across a voltage source 84. Again, a decoupling capacitor 86 will generally be provided for improving the transient response to the voltage source 84.

In FIG. 3, the current switch 72 includes a transistor 88 having a base current which is controlled by control circuit 78. As long as the input switch 76 is in its high impedance state, the level of base drive being supplied to transistor 88 of current switch 72 will be controlled so that the amount of current flowing through clamping diodes 90, 92 of clamping circuit 74 will remain at a low, and substantially constant value independently of changes in the amount of current being supplied to transistor 88 through deflection yoke 80. In order to accomplish this function, the current control circuit 78 operates to sense the voltage at the collector of transistor 88 and to maintain this voltage at a fixed level. Since this also maintains the voltage across diodes 90, 92 at a fixed level, the current passing through them will similarly be fixed.

Control circuit 78 includes a differential amplifier comprised of two transistors 94 and 96 which have their emitters commonly connected to a resistor 98 and hence to a voltage source $V_{CC}$ (illustrated as being +15 V).

The base of transistor 96 is connected to the junction between a resistor 100 and two series-connected diodes 102 and 104. The base of transistor 94, on the other hand, is connected to a +5 V supply. Each pair of diodes 90, 92 and 102, 104 have an electrode connected to the collector of transistor 88. The voltage at the base of transistor 96 will therefore be two diode drops above the collector of transistor 88. Since the collector of transistor 88 is clamped to about two diode drops below 5 volts, the base of transistor 96 will ride at a voltage level of about 5 volts, as does the base of transistor 94.

At any given steady state condition, the voltage across diodes 90, 92 will be approximately the same as the voltage across diodes 102, 104. The voltage drop across diodes 102, 104 is essentially fixed, however, since the current through them is constant. Any change in the current passing through clamping diodes 90, 92 will be reflected in a corresponding change in the voltage drop across them. Since the voltage drop across diodes 100, 102 is essentially constant, the voltage level at the base of transistor 96 will also reflect this change. This will introduce a change in the balance of current flow through transistors 94, 96 which will result in a change in base drive to transistor 88. The current flow through transistor 88 will thus be modified to counter the change in current through diodes 90, 92. The current flow through diodes 90, 92 is therefore stabilized at a substantially fixed level.

More specifically, a reduction in the level of current flow through diodes 90, 92 will cause an increase in the voltage at the base of transistor 96. The current through transistor 96 will therefore decrease, producing a commensurate increase in the current through transistor 94. Base drive to transistor 88 will therefore increase, increasing current flow through transistor 88 and thus diodes 90, 92.

Any increase in current flow through diodes 90, 92 will similarly be countered by a decrease in current flow through transistor 88.

When the input switch 76 is switched to its low impedance state, the voltage across it will drop to the saturation voltage level, which will effectively shunt to ground the base current which had been supplied to transistor 88. This will turn off the current switch.

The circuitry associated with transistor 88 is included in this circuit to provide overload protection, and to improve the switching response thereof. The circuit comprised of transistor 106 and resisters 108, 110 is included to limit current flow through transistor 88 to a specified maximum current level $I_O$ in the event of fault. The function of these elements is similar to the function of the corresponding elements of FIG. 2, except that now transistor 106 will be cut off during normal operation of the circuit. Diode 112 and capacitor 114 provide a small positive bias voltage at the emitter of transistor 88 so as to assist in switching transistor 88 to its "off" state when input switch 76 shifts to its low impedance, saturated state.

In FIG. 3, input switch 76 is shown as a switching transistor 116 operated by a logic NAND gate 118 in order to facilitate interconnection with a digitally oriented control system. This control system 20 (FIG. 1) again operates to regulate the "on" and "off" times of current switch 72 so as to thereby regulate the maximum deflection current $I_p$ passing through deflection coil 80. The magnitude of the voltage supplied by voltage source 84 is controlled for similar reasons.

Figure 4D:
Figure 4E:
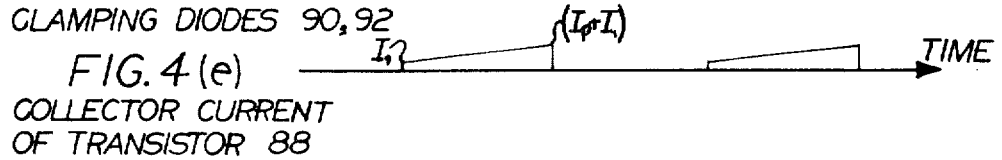

The improvement afforded by the circuitry illustrated in FIG. 3 may be more readily appreciated through consideration of the current waveforms of FIGS. 4(d) and (e). These current waveforms respectively illustrate the current flow through clamping diodes 90, 92 and through transistor 88 during operation to provide the yoke current shown in FIG. 4(a). It will be seen that during the interval in which transistor 88 is in its "on" state, the current through clamping diodes 90, 92 is maintained at an essentially constant level $I_1$, whereas the current through transistor 88 continually increases with increasing current through the deflection coil 80. Consequently, immediately prior to the switching of transistor 88 to its off state, only a small amount of stored charge will exist across the diodes 90, 92 which can be rapidly dissipated by the current flow through the yoke 80. A much reduced charge storage time $T_2$ therefore results. Additionally, since the amount of current flowing through the clamping diode pair is relatively low, the current flowing through transistor 88 need decrease by only a small amount in order to begin limiting the current flow due to deflection coil 80. This is true independently of the maximum current at which deflection yoke 80 operates. The disclosed circuit is therefore capable of providing higher operating speeds than was capable with prior art devices.

Although the invention has been described with respect to the preferred embodiment, it will be appreciated if various rearrangements and alterations of parts may be made without departing from the spirit and scope of the present invention, as defined in the appended claims.

What is claimed is:

1. Apparatus comprising:
   current switching means controllable to limit the level of current passing therethrough;
   clamping means for preventing saturation of said current switching means by preventing the voltage across said current switching means from dropping below a fixed limiting voltage level, greater than the saturation voltage of said current switching means;
   means for causing said current switching means to switch between a first state, wherein substantially no current flows through said current switching means, and a second state, wherein a controlled current flow passes through said current switching means and the voltage across said current switching means is at said limiting voltage level;
   circuit means coupled to said current switching means such that the operation of said current switching means influences the operation of said circuit means; and
   means for controlling said current switching means so as to control the current flow therethrough when said current switching means is in said second state, to limit current flow through said clamping means so that said current flow through said clamping means does not exceed a limiting current level, independently of variations in the amount of current passing between said circuit means and said current switching means, wherein said limiting current level is selected to be substantially smaller than the maximum current level which is expected will pass between said circuit means and said current switching means.

2. Apparatus as set forth in claim 1, wherein said circuit means comprises a voltage source for supplying a voltage level which is greater than said limiting voltage, and an inductive impedance coupled between said voltage source and said current switching means whereby the level of current passing through said inductive impedance into said current switching means will vary with time for at least an interval following the switching of said current switching means from said first state to said second state.

3. Apparatus as set forth in claim 2, wherein said inductive impedance is a magnetic deflection winding of a CRT display system.

4. Apparatus as set forth in claims 2 or 3 wherein said switching means for causing said current switching means to switch between first and second states comprises means for repetitively switching said current switching means between said first and second states and for varying the length of the intervals during which said current switching means is in said second state, so that the maximum level of current passing through said inductive impedance will also vary.

5. Apparatus as set forth in claim 1, wherein said means for controlling said current switching means includes means for providing an indication representative of the level of current flow through said clamping means to said current switching means, and means responsive to said indication for adjusting the operation of said current switching means to maintain said indication at a substantially fixed level.

6. Apparatus as set forth in claim 1, wherein said clamping means includes a fixed voltage supply in conjunction with at least one diode for coupling said voltage source to said current switching means, whereby said limiting voltage level is substantially fixed.

7. A deflection driver circuit for use in conjunction with a CRT employing means for providing magnetic deflection of an electron beam to achieve scanning of said electron beam across at least part of the face of said CRT, comprising:
   a deflection voltage source;
   current switching means connected across said deflection voltage source in series with said magnetic deflection means, said current switching means being controllable to vary the current flowing therethrough;
   means for causing said current switching means to periodically switch between a first state, wherein substantially no current passes through said current switching means, and a second state wherein a controlled current flow passes through said current switching means, thereby causing the current in said magnetic deflection means to also periodically vary and thereby produce said scanning of said electron beam;
   clamping means for preventing saturation of said current switching means by preventing the voltage across said current switching means from dropping below a fixed limiting voltage level, greater than the saturation voltage of said current limiting means; and
   means for controlling said current switching means so as to control the current flow through said current switching means, when said means is in said second state, to fix current flow through said clamping means at a preselected level independently of variations in the amount of current passing between said magnetic deflection means and said current switching means, wherein said preselected level is selected to be substantially smaller than the maximum level of current which is expected will pass between said magnetic deflection means and said current switching means.

8. Apparatus comprising:
current switching means controllable to limit the level of current passing therethrough;
clamping means for preventing the voltage across said current switching means from dropping below a fixed limiting voltage level, said fixed limiting voltage level being greater than the voltage at which saturation of said current switching means would occur;
means for causing said current switching means to switch between a first state, wherein substantially no current flows through said current switching means, and a second state, wherein a controlled current flow passes through said current switching means and the voltage across said current switching means is at said limiting voltage level;
circuit means connected across said current switching means such that the operation of said current switching means influences the operation of said circuit means; and
means for sensing the level of current flowing through said clamping means and for controlling said current switching means in accordance with said sensed level of current flow so as to control the current flow through said current switching means when said current switching means is in said second state to maintain a substantially fixed level of current flow through said clamping means, independently of variations in the amount of current passing between said circuit means and said current switching means, wherein said substantially fixed level of current flow is selected to be substantially smaller than the maximum current level which is expected will pass between said circuit means and said current switching means.

* * * * *